United States Patent
O et al.

(10) Patent No.: US 7,286,020 B1
(45) Date of Patent: Oct. 23, 2007

(54) TECHNIQUES FOR MONITORING AND REPLACING CIRCUITS TO MAINTAIN HIGH PERFORMANCE

(75) Inventors: Hugh Sungki O, Fremont, CA (US); Samit Sengupta, San Jose, CA (US); Joseph Michael Ingino, Jr., Los Altos, CA (US)

(73) Assignee: Altera Corporation, San Jose, CA (US)

( * ) Notice: Subject to any disclaimer, the term of this patent is extended or adjusted under 35 U.S.C. 154(b) by 121 days.

(21) Appl. No.: 11/231,641

(22) Filed: Sep. 21, 2005

(51) Int. Cl.
*G01R 31/00* (2006.01)
*G01R 23/00* (2006.01)
*H03K 19/003* (2006.01)
*G06F 11/16* (2006.01)

(52) U.S. Cl. .......................... 331/66; 331/44; 331/57; 326/10; 327/526

(58) Field of Classification Search .................. 331/44, 331/57, 66, 74, 75; 326/9, 10; 327/524, 327/526
See application file for complete search history.

(56) References Cited

U.S. PATENT DOCUMENTS

| | | | | |
|---|---|---|---|---|
| 5,563,928 | A | * | 10/1996 | Rostoker et al. ............. 377/20 |
| 6,084,933 | A | * | 7/2000 | Kubinec ....................... 375/362 |
| 6,897,543 | B1 | | 5/2005 | Huang et al. |
| 6,933,869 | B1 | | 8/2005 | Starr et al. |
| 6,940,307 | B1 | | 9/2005 | Liu et al. |
| 2002/0149398 | A1 | | 10/2002 | Ingino |
| 2002/0149407 | A1 | | 10/2002 | Ingino |
| 2002/0149433 | A1 | | 10/2002 | Ingino |
| 2002/0167367 | A1 | | 11/2002 | Ingino |
| 2003/0020528 | A1 | | 1/2003 | Ingino |
| 2003/0117166 | A1 | | 6/2003 | Ingino et al. |
| 2003/0120808 | A1 | | 6/2003 | Ingino et al. |
| 2003/0210099 | A1 | | 11/2003 | Ingino |
| 2004/0095701 | A1 | | 5/2004 | Ingino |
| 2005/0030061 | A1 | | 2/2005 | Ingino et al. |
| 2005/0225380 | A1 | | 10/2005 | Ingino |
| 2006/0054974 | A1 | | 3/2006 | O et al. |

\* cited by examiner

*Primary Examiner*—David Mis
(74) *Attorney, Agent, or Firm*—Steven Cahill

(57) ABSTRACT

Techniques are provided for monitoring the performance of circuits and replacing low performing circuits with higher performing circuits. A frequency detector compares the frequency of a first periodic signal to the frequency of a second periodic signal. The difference in the frequency between the first periodic signal and the second periodic signal indirectly indicates how much the threshold voltages of the transistors have shifted. The difference in frequency between the two periodic signals can be monitored to determine the speed and performance of circuits on the chip. The output of the frequency detector can also indicate when to replace low performing circuits with higher performing circuits. When the frequency of the second periodic signal differs from the frequency of the first periodic signal by a predefined percentage, a low performing circuit is replaced with a higher performing replica circuit.

20 Claims, 3 Drawing Sheets

TECHNIQUES FOR MONITORING AND REPLACING CIRCUITS TO MAINTAIN HIGH PERFORMANCE

BACKGROUND OF THE INVENTION

1. Field of the Invention

The present invention relates to electrical circuits, and more particularly, to techniques for monitoring the performance of circuits and replacing low performance circuits with higher performance circuits.

2. Description of Related Art

Integrated circuits (ICs) typically include numerous transistors such as field effect transistors (FETs). A FET turns on when an input voltage reaches its threshold voltage.

During the operation of an integrated circuit (IC) chip, the threshold voltages of transistors that are switching shift over time. The shift in threshold voltage is caused by the operating temperatures on the IC. Positive bias temperature instability (PBTI) causes the threshold voltages of n-channel MOSFETs to shift. Negative bias temperature instability (NBTI) causes the threshold voltages of p-channel MOSFETs to shift.

NBTI and PBTI can cause a relatively significant change in the threshold voltages of nanoscale CMOS technology. The shift in the transistor's threshold voltage can become significant enough to cause serious performance and reliability problems in advanced chip applications.

NBTI worsens at high operating temperatures, causing p-channel MOS threshold voltages to shift on the order of a few tenths of a mV. A change of a few millivolts can significantly degrade circuit performance and lead to functional failure. For example, if the threshold voltage of n-channel transistors increase due to PBTI, less current will flow through the transistors when their gate voltages are raised to a predefined point. As a result, the transistors will switch more slowly, and circuit performance degrades.

Stable transistor threshold voltages are a primary requirement for certain high precision analog circuitry. If the circuitry that generates an on-chip clock signal slows down, the clock signal frequency may decrease, slowing down large segments of circuitry on the chip. A reduction in the clock signal frequency can cause an unacceptable reduction in the chip's operating speed.

Therefore, it would be desirable to reduce the performance and reliability problems caused by the shift in transistor threshold voltages due to NBTI and PBTI.

BRIEF SUMMARY OF THE INVENTION

The present invention provides techniques for monitoring the performance of circuits and replacing low performing circuits with higher performing circuits. According to one embodiment of the present invention, a frequency detector compares the frequency of a first periodic signal to the frequency of a second periodic signal on an integrated circuit chip. The difference in the frequency between the first periodic signal and the second periodic signal indirectly indicates how much the threshold voltages of the transistors on the chip have shifted due to NBTI and PBTI. The difference in frequency between the two periodic signals can be monitored to determine the speed and performance of circuits on the chip.

The output of the frequency detector can also indicate when to replace low performing circuits with higher performing circuits. When the frequency of the second periodic signal differs from the frequency of the first periodic signal by a predefined percentage, a comparator causes a replica circuit to turn on. The comparator also causes a multiplexer to decouple a low performing circuit and replace the low performing circuit with the replica circuit.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
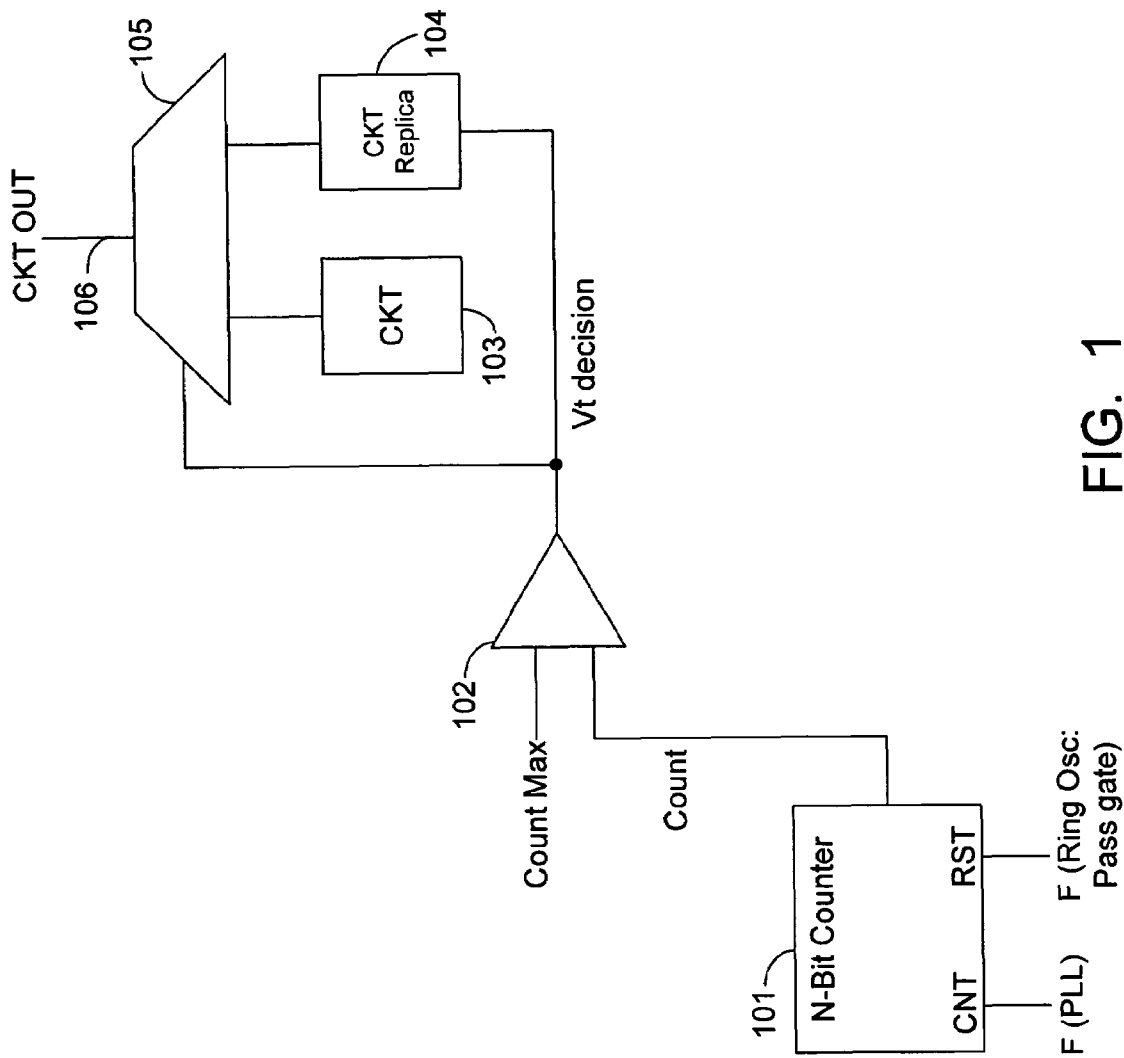
FIG. 1 illustrates circuitry for monitoring and replacing a circuit according to an embodiment of the present invention.

FIG. 1 illustrates a first embodiment of the present invention. The circuitry of FIG. 1 is a system for monitoring and replacing circuits on an IC. The system of FIG. 1 includes an N-bit counter 101. Counter 101 has two inputs that receive two periodic input signals. The count (CNT) input of counter 101 receives a signal from a phase pocked loop (PLL), and the reset (RST) input of counter 101 receives a signal from a ring oscillator.

The PLL generates a first on-chip clock signal that has a constant, stable frequency. The clock signal generated by the PLL is not effected by threshold voltage shifts caused NBTI and PBTI, because a PLL is a negative feedback system. Therefore, the frequency of the PLL signal does not change over time. The counter uses the frequency of the PLL as a reference point to determine the performance of circuits on the chip. Alternatively, a constant frequency signal can be generated by an oscillator or other circuitry.

The ring oscillator generates a second on-chip clock signal using, for example, a series of pass gates coupled together in a ring structure. During chip operation, the threshold voltages of the transistors on the chip shift due to NBTI and PBTI, including transistors in the ring oscillator and transistors in circuit 103, as described above. Typically, the threshold voltages of transistors in circuit 103 shift by an amount that is roughly the same as (or proportional to) the shift in the threshold voltages of transistors in the ring oscillator.

As the threshold voltages shift over time, the frequency of the ring oscillator relative to the frequency of the PLL changes. N-bit counter 101 functions as a frequency detector. The output signal Count of counter 101 indicates the relative difference between the frequencies of the PLL and ring oscillator signals in terms of percentage. The embodiment of FIG. 1 does not require the ring oscillator or the PLL to operate at particular frequencies, because counter 101 is responsive to a relative difference in frequency.

Counter 101 can, for example, comprise several flip-flops coupled in series that generate digital count signals. The digital value of the count signals can count up or count down in response to changes in the relative frequency difference between the two input signals. The digital count signals are then converted into an analog signal to produce the output Count signal using a digital-to-analog converter.

A comparator 102 compares the analog count signal to a maximum count threshold referred to as Count Max in FIG. 1. The Count Max threshold is set to a predefined value based on a desired performance of circuit 103. Alternatively, the threshold of comparator 102 can be a minimum count value.

The Count Max signal can be adjusted to account for variations in the threshold voltage shift of transistors in circuit 103 relative to the threshold voltage shift of transistors in the ring oscillator. The Count Max signal can be adjusted by an internal circuit or by a user generated input signal to change the chip's performance.

The Count Signal reaches the Count Max threshold value when the frequency of the ring oscillator signal reaches a predefined percentage of the frequency of the PLL signal. When the output Count signal increases above (or decreases below) the Count Max signal, the output voltage (Vt decision) of comparator 102 changes state.

The output voltage of comparator 102 controls multiplexer 105 and replica circuit 104. Replica circuit 104 can be an exact duplicate of the circuitry contained in circuit 103 or a functional equivalent. Before the output voltage of comparator 102 changes state, replica circuit 104 is off, and its transistors are not switching. Therefore, the threshold voltages of the transistors in replica circuit 104 remain constant, because they are not effected by NBTI and PBTI. Also, multiplexer 105 couples the output signal of circuit 103 to its output 106, before the output voltage of comparator 102 changes state.

When the Vt decision output voltage of comparator 102 changes state, replica circuit 104 turns on. Also, multiplexer 105 decouples circuit 103 from its output 106 and couples replica circuit 104 to its output 106. In this way, the system of FIG. 1 replaces circuit 103 when a variation in the frequency of the ring oscillator signal indicates that the threshold voltages of transistors in circuit 103 have changed enough to degrade the circuit's performance. The Count Max threshold is set to a value that indicates a minimum level of circuit performance.

Thus, the embodiment of FIG. 1 provides a system for increasing circuit performance by replacing a circuit with a replica circuit after a signal has indicated that the circuit's threshold voltages have degraded below an acceptable level. Replica circuits can be provided for any circuits on a chip. However, replica circuits tend to increase the die size of a chip. Therefore, according to a preferred embodiment of the present invention, replica circuits are provided only to replace high performance circuits on a chip and/or only circuits that lie within critical signal paths.

According to another embodiment of the present invention, the Count signal is measured to determine the relative speed of circuits on the chip. The Count signal varies based on the transistor threshold voltages in the ring oscillator. Therefore, the count signal can be used as an indirect measure of the relative speed of the transistors and circuits on the whole chip. By measuring the count signals of multiple chips, the chips can be compared to determine their relative speeds and performance levels. The results of these comparisons can be used to separate low performance chips from higher performance chips.

Figure 2:
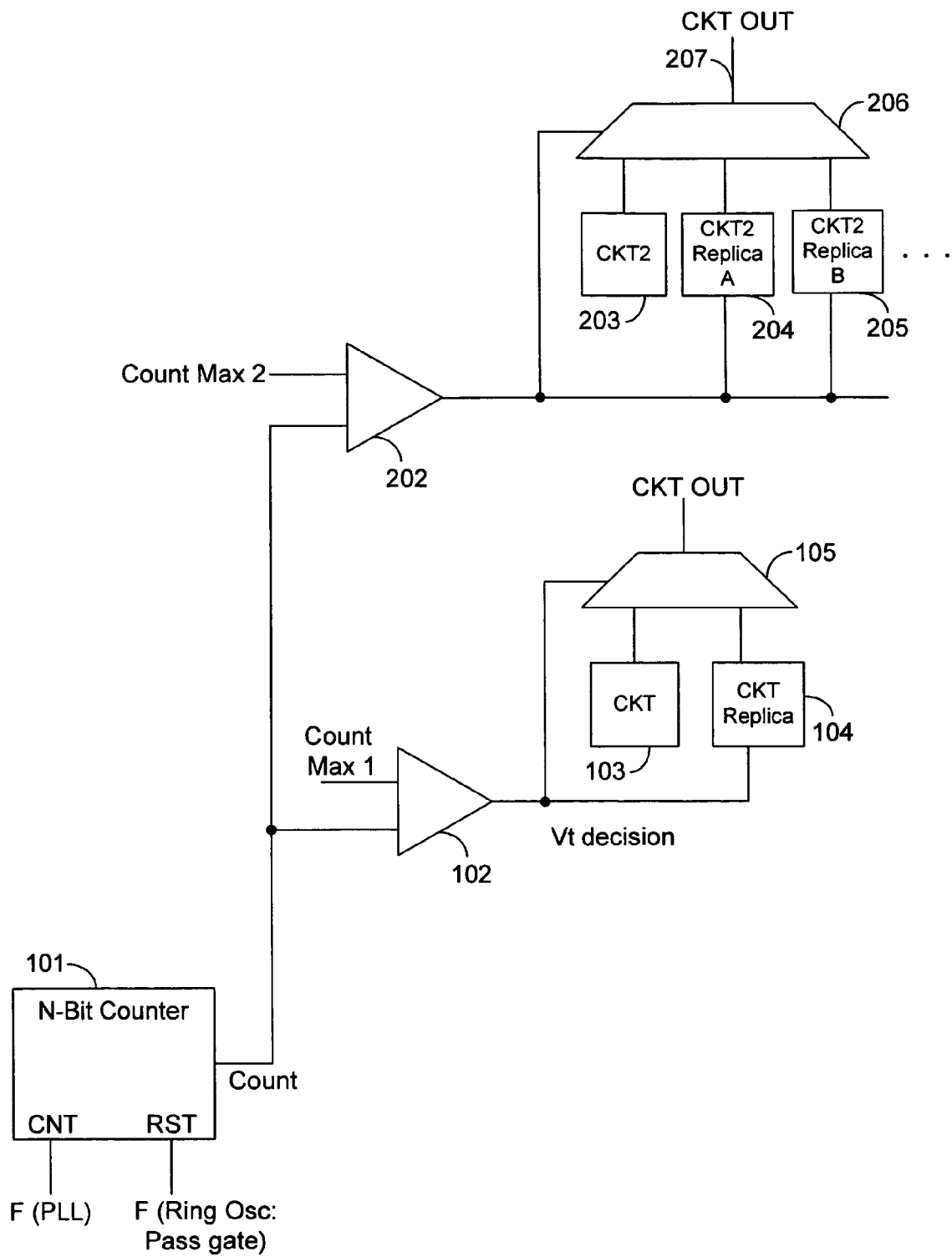
FIG. 2 illustrates example of circuitry for monitoring and replacing multiple circuits according to another embodiment of the present invention.

FIG. 2 illustrates another embodiment of the present invention. The embodiment of FIG. 2 illustrates how the techniques of the present invention can be applied to replace multiple circuits on a chip. According to this embodiment, the Count signal generated by counter 101 indicates the relative difference between the frequencies of the PLL and ring oscillator signals in terms of percentage, as described above.

A second comparator 202 compares the Count signal to a second maximum count threshold Count Max 2. Alternatively, the threshold can represent a minimum count value. The Count Max 2 threshold is set to a value corresponding to a point at which the performance of circuit 203 degrades below an acceptable level.

The output signal of comparator 202 controls multiplexer 206 and replica circuits 204 and 205. Replica circuits 204 and 205 can be exact duplicates of circuit 203 or functional equivalents. Before the output signal of comparator 202 changes state, replica circuits 204 and 205 are off, and the threshold voltages of the transistors in replica circuits 204 and 205 remain constant.

When the Count signal exceeds the maximum count threshold of comparator 202 (or drops below a minimum count threshold), the output signal of comparator 202 changes state, causing replica circuit A 204 to turn on. Also, multiplexer 206 decouples circuit 203 from its output 207, and couples replica circuit 204 to its output 207. Thus, replica circuit 204 replaces circuit 203 when the Count signal exceeds the Count Max 2 threshold.

After the transistors in replica circuit 204 begin to switch, their threshold voltages begin to shift. Comparator 202 can monitor the performance of replica circuit 204 if the threshold voltage Count Max 2 is adjusted accordingly. The Count Max 2 threshold is reset to a value corresponding to a point at which the performance of replica circuit 204 degrades below an acceptable level. Before the Count signal reaches the readjusted value of Count Max 2, replica circuit B 205 is off, and the threshold voltages of the transistors in replica circuit 205 remain constant.

Alternatively, the count signal can be reset to its original value (or a new value), and the Count Max 2 threshold remains constant or is adjusted to reflect a minimum acceptable performance of replica circuit 204. In this embodiment, counter 101 can receive a reset signal or a clear signal that causes the count signal to reset to a starting value.

When the Count signal exceeds the current value of Count Max 2, the output signal of comparator 202 changes state again. Replica circuit 205 is designed so that it remains off until the output signal of comparator 202 changes state a second time. For example, replica circuit 205 can remain off until it senses to two rising edges (or two falling edges) in the output signal of comparator 202.

Thus, replica circuit 205 turns on after it senses a second transition in the output signal of comparator 202. Also, multiplexer 206 decouples replica circuit 204 from its output 207, and couples replica circuit 205 to its output 207 when the second transition at the output of comparator 202 occurs. Additional replica circuits can be coupled in parallel with replica circuits 204 and 205.

Thus, the embodiment of FIG. 2 provides a technique for using the Count signal to replace multiple high precision circuits on a chip with replica circuits. A unique value can be selected for the minimum performance required of each high precision circuit, because each circuit is associated with a unique Count Max threshold. The present invention also allows a replica circuit to be replaced with an additional replica circuit after the performance of the original replica circuit has degraded below an acceptable level.

Figure 3:
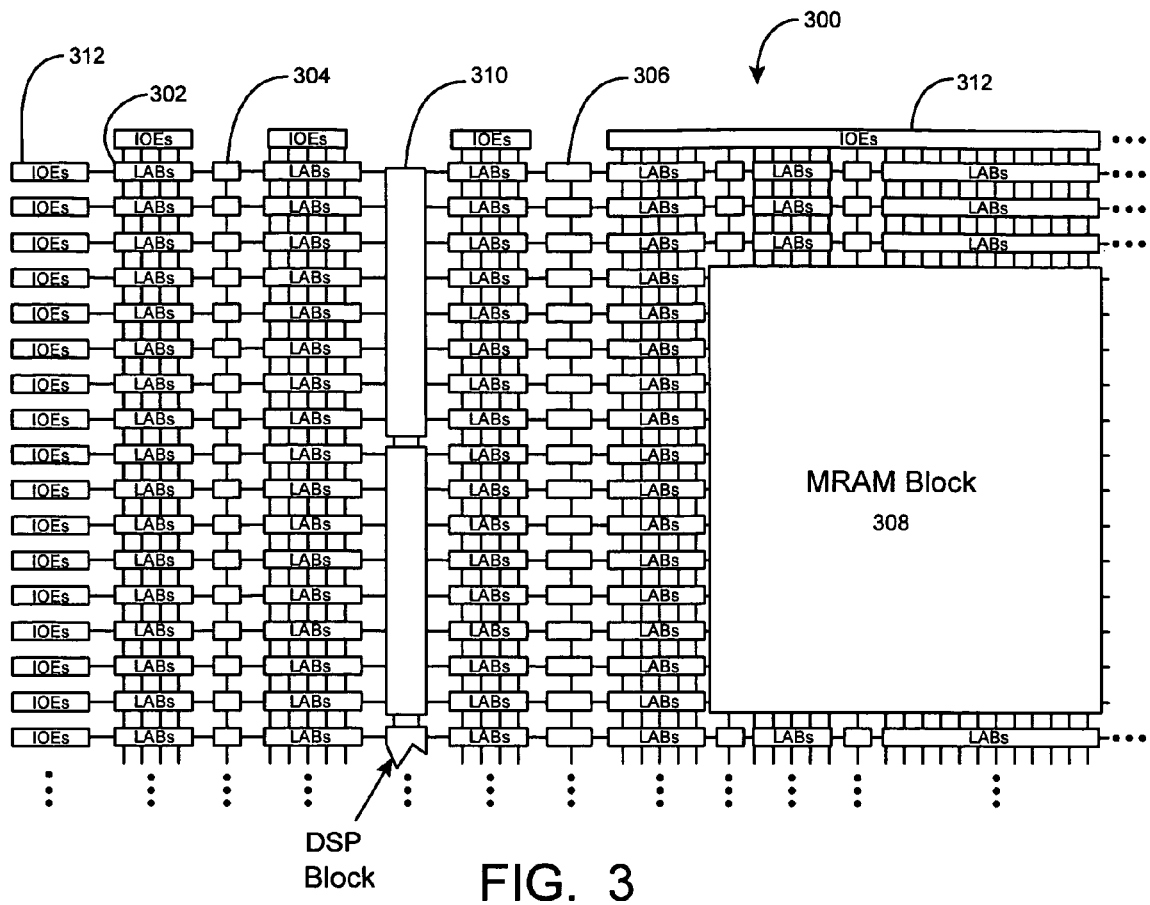
FIG. 3 is a simplified block diagram of a field programmable gate array that can be used with the techniques of the present invention.

FIG. 3 is a simplified partial block diagram of one example of FPGA 300 that can include aspects of the present invention. It should be understood that the present invention can be applied to numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 300 is an example of a programmable logic integrated circuit in which techniques of the present invention can be implemented. FPGA 300 includes a two-dimensional array of programmable logic array blocks (or LABs) 302 that are interconnected by a network of column and row interconnects of varying length and speed. LABs 302 include multiple (e.g., 10) logic elements (or LEs).

An LE is a programmable logic block that provides for efficient implementation of user defined logic functions. A FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 300 also includes a distributed memory structure including RAM blocks of varying sizes provided throughout the array. The RAM blocks include, for example, 512 bit blocks 304, 4K blocks 306, and a block 308 providing 512K bits of RAM. These memory blocks can also include shift registers and FIFO buffers.

FPGA 300 further includes digital signal processing (DSP) blocks 310 that can implement, for example, multipliers with add or subtract features. I/O elements (IOEs) 312 located, in this example, around the periphery of the device support numerous single-ended and differential I/O standards. It is to be understood that FPGA 300 is described herein for illustrative purposes only and that the present invention can be implemented in many different types of PLDs, FPGAs, and the like.

Figure 4:
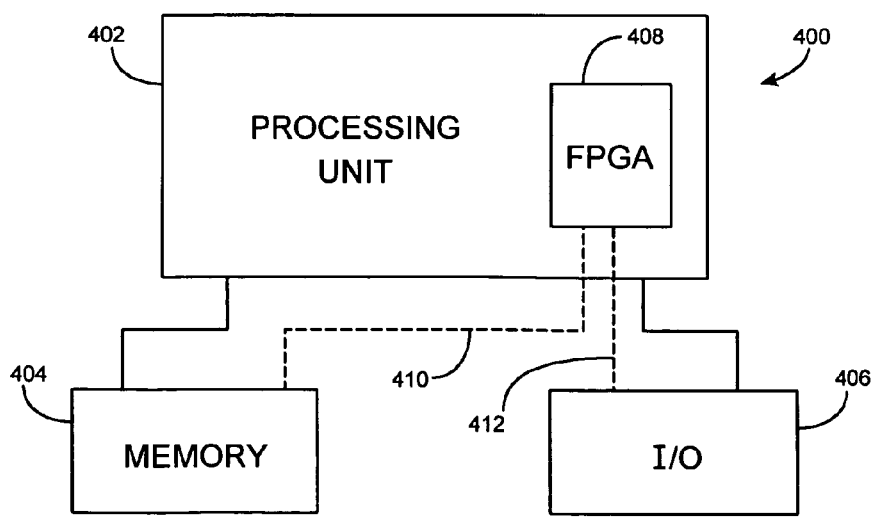
FIG. 4 is a block diagram of an electronic system that can implement embodiments of the present invention.

While FPGAs of the type shown in FIG. 3 provide many of the resources required to implement system level solutions, the present invention can also benefit systems wherein a FPGA is one of several components. FIG. 4 shows a block diagram of an exemplary digital system 400, within which the present invention can be embodied. System 400 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 400 can be provided on a single board, on multiple boards, or within multiple enclosures.

System 400 includes a processing unit 402, a memory unit 404 and an I/O unit 406 interconnected together by one or more buses. According to this exemplary embodiment, an FPGA 408 is embedded in processing unit 402. FPGA 408 can serve many different purposes within the system in FIG. 4. FPGA 408 can, for example, be a logical building block of processing unit 402, supporting its internal and external operations. FPGA 408 is programmed to implement the logical functions necessary to carry on its particular role in system operation. FPGA 408 can be specially coupled to memory 404 through connection 410 and to I/O unit 406 through connection 412.

Processing unit 402 can direct data to an appropriate system component for processing or storage, execute a program stored in memory 404 or receive and transmit data via I/O unit 406, or other similar function. Processing unit 402 can be a central processing unit (CPU), microprocessor, floating point coprocessor, graphics coprocessor, hardware controller, microcontroller, field programmable gate array programmed for use as a controller, network controller, and the like. Furthermore, in many embodiments, there is often no need for a CPU.

For example, instead of a CPU, one or more FPGAs 408 can control the logical operations of the system. In an embodiment, FPGA 408 acts as a reconfigurable processor, which can be reprogrammed as needed to handle a particular computing task. Alternately, FPGA 408 can itself include an embedded microprocessor. Memory unit 404 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A method for monitoring performance of circuits on a chip, the method comprising:
   receiving first and second periodic signals;
   comparing a frequency of the first periodic signal to a frequency of the second periodic signal using a frequency detector to generate a frequency difference signal;
   comparing the frequency difference signal to a first threshold to generate a first decision signal;
   turning on a first replica circuit in response to the first decision signal; and
   selecting an output signal of the first replica circuit and deselecting an output signal of a first original circuit in response to the first decision signal.

2. The method defined in claim 1 wherein the first threshold is set to indicate when threshold voltages of transistors in the first original circuit have changed enough to degrade performance of the first original circuit.

3. The method defined in claim 1 further comprising:
   adjusting the first threshold to account for variations in a threshold voltage shift of transistors in the first original circuit relative to a threshold voltage shift of transistors in a circuit that generates one of the first and the second periodic signals.

4. The method defined in claim 1 further comprising:
   comparing the frequency difference signal to a second threshold using a comparator to generate a second decision signal; and
   turning on a second replica circuit in response to the second decision signal.

5. The method defined in claim 4 further comprising:
   selecting an output signal of the second replica circuit and deselecting an output signal of a second original circuit in response to the second decision signal.

6. The method defined in claim 5 further comprising:
   comparing the frequency difference signal to a third threshold to generate a third decision signal; and
   turning on a third replica circuit in response to the third decision signal.

7. The method defined in claim 6 further comprising:
selecting an output signal of the third replica circuit and deselecting an output signal of the second replica circuit in response to the third decision signal.

8. The method defined in claim 1 wherein the frequency detector is a counter circuit.

9. An integrated circuit chip comprising:
a frequency detector coupled to receive a first periodic signal and a second periodic signal;
a first comparator coupled to receive an output signal of the frequency detector and a first threshold;
a first circuit and a first replica circuit, the first replica circuit being coupled to receive an output signal of the first comparator; and
a first multiplexer having a first input coupled to the first circuit, a second input coupled to the first replica circuit, and a third select input coupled to receive the output signal of the first comparator.

10. The integrated circuit chip defined in claim 9 further comprising:
a second comparator coupled to receive the output signal of the frequency detector and a second threshold;
a second circuit and a second replica circuit, the second replica circuit being coupled to receive an output signal of the second comparator; and
a second multiplexer having a first input coupled to the second circuit, a second input coupled to the second replica circuit, and a third select input coupled to receive the output signal of the second comparator.

11. The integrated circuit chip defined in claim 10 further comprising:
a third replica circuit, wherein an input of the third replica circuit is coupled to receive the output signal of the second comparator, and an output of the third replica circuit is coupled to a fourth input of the second multiplexer.

12. The integrated circuit chip defined in claim 11 wherein the first periodic signal is generated by a phase locked loop and the second periodic signal is generated by a ring oscillator.

13. The integrated circuit chip defined in claim 9 wherein the integrated circuit chip is a field programmable gate array.

14. The integrated circuit defined in claim 13 wherein the field programmable gate array is part of a digital system that includes a processor, a memory unit, and an I/O unit.

15. An integrated circuit chip comprising:
means for comparing a frequency of a first periodic signal to a frequency of a second periodic signal to generate a frequency difference signal;
means for determining when the frequency difference signal reaches a first threshold and, in response, turning on a first replica circuit; and
means for replacing an output signal of a first circuit with an output signal of the first replica circuit when the frequency difference signal reaches the first threshold.

16. The integrated circuit defined in claim 15 further comprising:
means for determining when the frequency difference signal reaches a second threshold and, in response, turning on a second replica circuit; and
means for replacing an output signal of a second circuit with an output signal of the second replica circuit when the frequency difference signal reaches the second threshold.

17. The integrated circuit defined in claim 16 further comprising:
means for determining when the frequency difference signal reaches a third threshold and, in response, turning on a third replica circuit; and
means for replacing an output signal of the second replica circuit with an output signal of the third replica circuit.

18. The integrated circuit defined in claim 15 wherein the first periodic signal is generated by a phase locked loop and the second periodic signal is generated by a ring oscillator.

19. The integrated circuit defined in claim 15 wherein the integrated circuit chip is a field programmable gate array.

20. The integrated circuit defined in claim 19 wherein the field programmable gate array is part of a digital system that includes a processor, a memory unit, and an I/O unit.

* * * * *